United States Patent
Field et al.

(10) Patent No.: US 6,323,653 B1
(45) Date of Patent: Nov. 27, 2001

(54) MAGNETIC DETECTION OF SHORT CIRCUIT DEFECTS IN PLATE STRUCTURE

(75) Inventors: John E. Field, Santa Cruz; Stephanie J. Oberg, Sunnyvale, both of CA (US)

(73) Assignee: Candescent Technologies Corporation, San Jose, CA (US)

( * ) Notice: Subject to any disclaimer, the term of this patent is extended or adjusted under 35 U.S.C. 154(b) by 0 days.

(21) Appl. No.: 09/539,192

(22) Filed: Mar. 30, 2000

Related U.S. Application Data (62) Division of application No. 08/903,022, filed on Jul. 30, 1997, now Pat. No. 6,118,279.

(51) Int. Cl.$^7$ .................................................. G01R 31/28
(52) U.S. Cl. .............................................. 324/529; 702/59
(58) Field of Search ......................... 324/95, 522, 537, 324/529; 702/59

(56) References Cited

U.S. PATENT DOCUMENTS

| | | | |
|---|---|---|---|
| 3,753,089 | 8/1973 | Gunn et al. | 324/52 |
| 3,882,287 | 5/1975 | Simmonds | 179/175.3 A |
| 3,992,663 | 11/1976 | Seddick | 324/52 |
| 4,186,338 | 1/1980 | Fichtenbaum | 324/52 |
| 4,542,333 | 9/1985 | Koontz | 324/52 |
| 4,829,238 | 5/1989 | Goulette et al. | 324/95 |
| 4,992,728 | 2/1991 | McCord et al. | 324/158 P |
| 5,006,788 | 4/1991 | Goulette et al. | 324/95 |
| 5,073,754 | 12/1991 | Henley | 324/529 |
| 5,210,498 * | 5/1993 | Paananen | 324/529 |
| 5,218,294 | 6/1993 | Soiferman | 324/158 R |
| 5,309,108 | 5/1994 | Maeda et al. | 324/501 |
| 5,406,209 | 4/1995 | Johnson et al. | 324/750 |
| 5,424,633 | 6/1995 | Soiferman | 324/158.1 |
| 5,462,467 | 10/1995 | Macaulay et al. | 445/50 |
| 5,475,695 | 12/1995 | Caywood | 371/27 |
| 5,486,753 | 1/1996 | Khazam et al. | 324/72.5 |
| 5,517,110 | 5/1996 | Soiferman | 324/158.1 |
| 5,559,389 | 9/1996 | Spindt et al. | 313/310 |
| 5,564,959 | 10/1996 | Spindt et al. | 445/24 |
| 5,578,930 | 11/1996 | Sheen | 324/530 |
| 5,596,283 * | 1/1997 | Mellitz et al. | 324/754 |
| 5,714,888 | 2/1998 | Naujoks | 324/750 |
| 5,821,759 | 10/1998 | Scaman et al. | 324/529 |
| 6,107,806 * | 8/2000 | Field | 324/529 |

FOREIGN PATENT DOCUMENTS

| | | |
|---|---|---|
| 31 11 393 A1 | 9/1982 | (DE) . |
| 56-154678 | 11/1981 | (JP) . |

OTHER PUBLICATIONS

Ferguson et al, "CMOS Fault Extractor for Inductive Fault Analysis," *IEEE Transactions on Computer–Aided Design*, vol. 7, No. 11, Nov. 1988, pp. 1181–1988.

Maly et al, "Systematic Characterization of Physical Defects for Fault Analysis of MOS IC Cells," *Proc. Int'l. Test Conf.*, Oct. 18, 1984, pp. 390–399.

Resnick et al, *Physics for Students of Science and Engineering* (John Wiley & Sons, 2nd ed.), 1963, pp. 780 and 780, (Month unavailable).

Danker, "Current Probe for PCB Tracks", *Elektor Electronics*, vol. 18, No. 206, Dec. 1, 1992, pp. 81–82.

* cited by examiner

*Primary Examiner*—Ernest Karlsen
*Assistant Examiner*—Russell M. Kobert
(74) *Attorney, Agent, or Firm*—Skjerven Morrill MacPherson LLP; Ronald J. Meetin (57) ABSTRACT

Short circuit detection is performed on a plate structure (10) in which a group of first electrical conductors (32) are nominally electrically insulated from, and cross, a group of second electrical conductors (48). In particular, a magnetic current-sensing operation is performed on at least part of the conductors to produce current data indicative of how much, if any, current flows through each of at least part of the conductors. The current data is then examined to determined whether there appears to be a short circuit defect at any location where one of the first conductors crosses one of the second conductors.

12 Claims, 6 Drawing Sheets

MAGNETIC DETECTION OF SHORT CIRCUIT DEFECTS IN PLATE STRUCTURE

CROSS REFERENCE TO RELATED APPLICATION

This is a division of U.S. patent application Ser. No. 08/903,022, filed Jul. 30, 1997, now U.S. Pat. No. 6,118,279. This is also related to Field, U.S. patent application Ser. No. 08/903,021, filed Jul. 30, 1997, now U.S. Pat. No. 6,107,806.

REFERENCE TO MICROFICHE APPENDICES

Appendices A, B, and C, which constitute parts of this disclosure, are microfiche appendices consisting of three sheets of microfiche having a total of 66 frames.

FIELD OF USE

This invention relates to techniques for detecting short circuit defects in plate structures such as a baseplate structure of a flat-panel cathode-ray tube ("CRT") display.

BACKGROUND

A flat-panel display is a matrix-addressed flat-panel device typically formed with a baseplate structure and a faceplate structure situated opposite the baseplate structure. In a flat-panel CRT display of the gated field-emission type ("field-emission display"), the baseplate structure contains a generally flat baseplate, a lower level of generally parallel emitter electrodes extending over the interior surface of the baseplate, a dielectric layer overlying the emitter electrodes, and an upper level of control (or gate) electrodes extending over the dielectric layer generally perpendicular to the emitter electrodes. Electron-emissive elements are situated in cavities in the dielectric layer and are exposed through openings in the control electrodes.

During operation of the field-emission display ("FED"), electrons emitted from selected electron-emissive elements move towards the faceplate structure. The electrons strike corresponding light-emissive regions in the faceplate structure and cause them to emit light that produces an image on the exterior surface of a transparent faceplate. Each of the locations at which one of the control electrodes crosses one of the emitter electrodes in the baseplate structure defines a picture element ("pixel") in a black and white display and a sub-pixel in a color display, three sub-pixels normally forming a color pixel.

Various types of defects can arise during flat-panel display fabrication. In a display having a plate structure that contains multiple levels of electrodes such as the baseplate structure of an FED, short circuits are of particular concern. A short circuit defect arises when an electrode in one level is unintentionally connected to an electrode in another level. For example, a short circuit defect can occur in an FED when an electrically conductive path extends through the inter-electrode dielectric layer to connect a control electrode to an emitter electrode.

Detection of short circuit defects is an important part of flat-panel display manufacture. In some instances, a short circuit defect can be corrected before the plate structures are connected together, thereby transforming a potentially defective display into a fully operative one. In other instances, a short circuit defect can be cut out of the display. While part of all of a pixel or sub-pixel is lost, the performance of the remainder of the display is often not affected significantly. The display is typically acceptable for certain applications.

Each location at which a control electrode crosses an emitter electrode in an FED could be tested for a short circuit defect by observing what happens when a suitable voltage is applied between the two electrodes while the remainder of the electrodes in the upper and lower levels are suitably grounded. Unfortunately, this type of short circuit testing procedure is extremely time-consuming for an PED with a large number of pixels.

Henley, U.S. Pat. No. 5,073,754, describes how a matrix-addressed liquid-crystal display ("LCD") is tested for short circuit defects using a magnetic sensor of undisclosed configuration. The magnitude of current flowing through a short circuit defect increases with the magnitude of the sensed magnetic field. Henley scans the magnetic sensor across the periphery of the LCD and then examines the magnitudes of the sensed magnetic field to detect any short circuit defects between electrical conductors in one level and crossing electrical conductors in another level. As a result, currents that characterize short circuit defects can be identified rapidly.

When magnetic fields of relatively comparable strength are detected on multiple conductors at each level, Henley has trouble determining which of the conductor-crossing locations have short circuit defects and which do not. Instead, Henley simply classifies all of the concerned conductor-crossing locations as having short circuit defects even though short circuit defects normally do not exist at some of these locations. It is desirable to have a magnetic-sensing-based technique that more accurately determines the location of short circuit defects in plate structures, especially baseplate structures of matrix-addressed flat-panel CRT displays.

GENERAL DISCLOSURE OF THE INVENTION

The present invention furnishes techniques for processing magnetically obtained current data to accurately detect current-related defects such as short circuit defects. The techniques of the invention are typically employed in testing matrix-addressed plate structures for short circuit defects. Specifically, short circuit defects in baseplate structures of flat-panel CRT displays can be rapidly and accurately located in the invention.

In one aspect of the invention, a probability-based technique is utilized to detect short circuit defects in a plate structure having a group of first electrical conductors and a group of second electrical conductors that cross the first conductors. The second conductors are nominally electrically insulated from the first conductors. The expression "nominally electrically insulated" here means that the second conductors are substantially electrically insulated from the first conductors except for short circuit defects that variously electrically couple one or more of the second conductors to one or more of the first conductors.

Magnetic current sensing is performed on at least part of the first and second conductors to produce current data indicative of how much, if any, current flows through each of at least part of the conductors. A short circuit defect probability analysis is then applied to the current data for selecting a location where an identified one of the first conductors crosses an identified one of the second conductors as being most probable of having a short circuit defect. The sensed current carried by the identified first conductor is normally greater in value than the sensed current carried by any of the other first conductors. Also, the sensed current carried by the identified first conductor is normally closer in value to the sensed current carried by the identified second conductor than the sensed current flowing through any other second conductor.

The selected electrode-crossing location can be optically examined to determine whether it has the physical characteristics of a short circuit defect. A repair operation can also be performed at the selected location to remove any short circuit defect present there.

Assuming the presence of a short circuit defect at the selected electrode-crossing location, the plate structure can be checked for additional short circuit defects by first modifying the current data to subtract current of a selected short circuit value from the values of the sensed currents carried by the two conductors that define the selected location. The modified current data is then examined to determine whether current of value sufficient for at least one other short circuit defect seemingly flows through at least one first conductor and through at least one second conductor. If so, a short circuit defect probability analysis is applied to the modified current data for selecting a further electrode-crossing location as now being most probable of having a short circuit defect. Optical inspection and/or repair effort can be performed at the further electrode-crossing location. This procedure can then be appropriately repeated to find any further short circuit defects.

Detecting short circuit defects in the preceding manner is very efficient. To the extent that an electrode-crossing location does not actually have a short circuit defect even though that location is found during a stage of the probability analysis to be most probable of having a short circuit defect, that electrode-crossing can be eliminated from further stages of the probability analysis. This enables the probability analysis procedure to return to the correct track at the next stage. The net result is that short circuit defects are located more accurately in the present invention than with Henley's technique. Also, less overall time is needed, on the average, to repair short circuit defects in the present invention than in Henley.

In another aspect of the invention, a magnetic head is moved over at least part of the electrical conductors in a plate structure of the above type to enable the head to sense changes in current-induced magnetic flux and to provide a head output signal indicative of any sensed changes in magnetic flux while a time-varying driving voltage is simultaneously applied between the first conductors, on one hand, and the second conductors, on the other hand. The head output signal is evaluated to produce data indicative of how much current flows through at least part of the conductors. The current data is then examined to determine whether there is a short circuit defect at any of the electrode-crossing locations.

The driving voltage is typically provided at a selected frequency, normally at least 70 Hz, so as to be safely above the 60-Hz and 50-Hz power-line frequencies employed respectively in the United States and Europe. By performing the short circuit defect detection in this manner, the head output signal normally has a frequency component at the selected frequency. The signal processing circuitry that generates data indicative of how much current flows in the conductors can search for this frequency "signature" of the driving voltage. Noise, especially noise resulting from nearby equipment using power supplied at 60 Hz or 50 Hz, is reduced in the resulting current data, thereby improving the accuracy of the current determination and the short circuit detection. The invention thus provides a substantial advance.

BRIEF DESCRIPTION OF THE DRAWINGS

Like reference symbols are employed in the drawings and in the description of the preferred embodiments to represent the same, or very similar, item or items

DESCRIPTION OF THE PREFERRED EMBODIMENTS

Figure 1A:
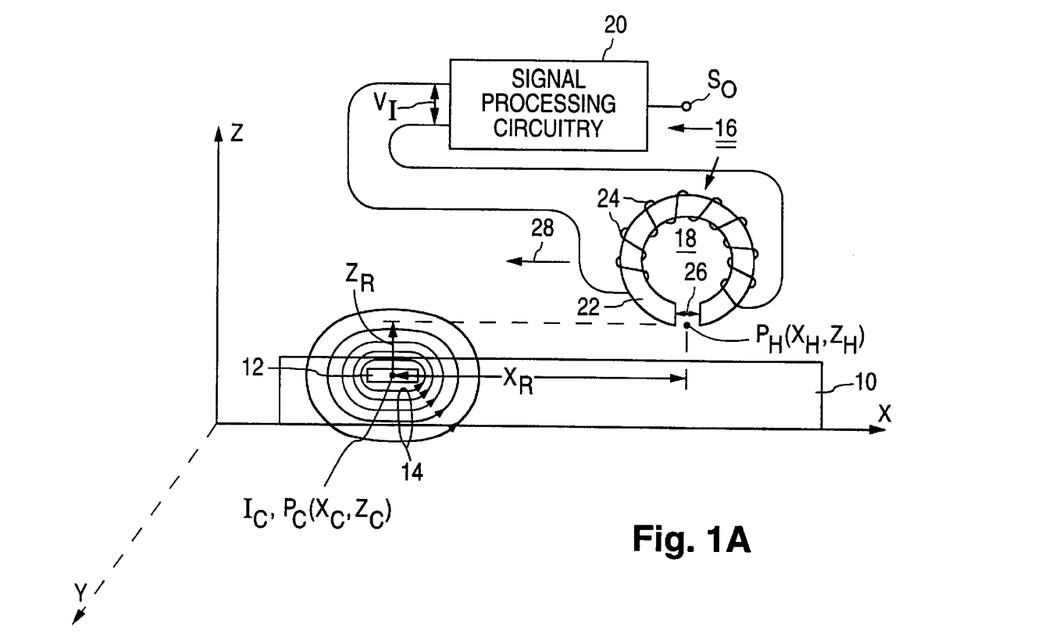
FIGS. 1A and 1B are schematic diagrams that present a simplified model of how a current sensor configured according to the invention magnetically senses current that flows in a plate structure.
Figure 1B:
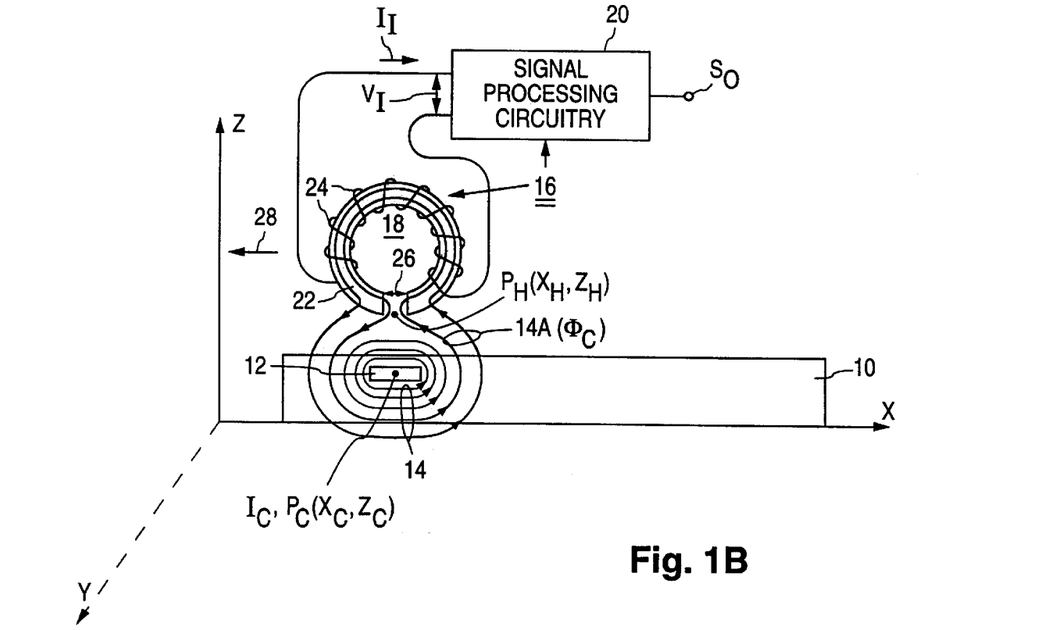

Referring to the drawings, FIGS. 1A and 1B (collectively "FIG. 1") illustrate a simplified model of a magnetic technique employed in the present invention to determine current flow in a generally flat plate structure 10. For reference purposes, the bottom surface of plate structure 10 lies along the xy plane of an xyz coordinate system where the z coordinate is the vertical coordinate. Dimensions in the y direction are not shown in FIG. 1. The illustrated part of plate structure 10 is a cross section in the vertical xz plane of the coordinate system.

Plate structure 10 contains a generally straight primary electrical conductor 12 extending in the y direction. Primary conductor 12 carries a primary conductor current $I_C$. In the model of FIG. 1, current $I_C$ flows out of the plane of the figure.

Current $I_C$ produces a magnetic field indicated by lines 14 of magnetic flux. Since current $I_C$ flows out of the plane of FIG. 1, the magnetic field is directed counterclockwise in FIG. 1. The strength of the magnetic field is directly proportional to the magnitude of current $I_C$. Also, the strength of the magnetic field decreases with increasing distance away from conductor 12 as indicated by the increased spacing between magnetic flux lines 14 as the distance away from conductor 12 increases.

A magnetically based current sensor 16 configured in accordance with the invention determines the approximate value of current $I_C$ by sensing changes in magnetic flux 14. Current sensor 16 is formed with a magnetic head 18, signal processing circuitry 20, and a location sensor (not shown here) that determines the location of magnetic head 18 relative to one or more reference locations on plate structure 10. The sensed changes in magnetic flux 14 may be actual magnetic flux changes or/and relative changes arising from the movement of head 18 relative to conductor 12 and thus relative to plate structure 10.

Magnetic head 18 is formed with a core 22 and a coil 24 of electrical wire wound a number of times around core 22. Core 22 typically consists of magnetic material such as iron.

A gap 26 filled with low-permeability material is present at the bottom of core 22. Head 18 also includes a housing (not shown here) that encloses core 22 and coil 24. The housing has an opening below gap 26. The ends of coil 24 extend through the housing and are connected to signal processing circuitry 20.

Current sensor 16 operates in the following manner. Magnetic head 18 is placed over plate structure 10 close to, but spaced apart vertically from, its upper surface. At least the bottom of core 22 of sensor 18 passes through the vertical xz plane. At the stage shown in FIG. 1A, head 18 is too far away from conductor 12 for sensor 16 to be able to sense changes in magnetic flux 14.

More particularly, magnetic head 18 senses the sum of changes in current-induced magnetic flux 14 and changes in magnetic flux arising from other sources. Sensed changes in the magnetic flux produced by currents flowing in other electrical conductors in plate structure 10 are often so high when head 18 is at the location depicted in FIG. 1A that sensor 16, specifically signal processing circuitry 20, cannot determine what part of the total sensed change in magnetic flux is due to changes in flux 14. Even if currents flowing through other conductors in plate structure 10 are not of concern, environmental magnetic noise from nearby electrical equipment is often so great that sensor 16 cannot distinguish changes in magnetic flux 14 from changes in magnetic flux arising from the environmental magnetic noise.

At the stage depicted in FIG. 1B, magnetic head 18 has been moved relative to conductor 12, and thus relative to plate structure 10, in the negative x direction to a position directly above conductor 12. Arrow 28 in FIG. 1 indicates the direction of movement. Although head 18 is spaced vertically apart from conductor 12 at the stage shown in FIG. 1B, head 18 is sufficiently close to conductor 12 for sensor 16 to be able to adequately sense changes in magnetic flux 14. Of the total magnetic flux change sensed by head 18, the component (if any) arising from currents flowing in other conductors in structure 10 is so small compared to the component arising from current $I_C$ as to be negligible. With head 18 directly above conductor 12, the relative effect of environmental magnetic noise is small enough to enable changes in flux 14 to be isolated with suitable filtering.

For sensor 16 to be able to sense changes in magnetic flux 14 during a period in which current-sensing information is being gathered, current $I_C$ must be changing suitably with time or magnetic head 18 must be moving relative to conductor 12, preferably in the (positive or negative) x direction, as head 18 reaches the position above conductor 12. When current $I_C$ varies appropriately with time during a current-sensing period, sensor 16 is typically operated so that head 18 is also undergoing x-direction movement relative to conductor 12.

When magnetic head 18 passes above conductor 12 in the manner shown in FIG. 1B, a portion 14A of magnetic flux 14 passes through core 22. Magnetic flux portion 14A varies with time due to the time variation of current $I_C$ or/and the x-direction movement of head 18 relative to plate structure 10. Although not indicated in FIG. 1B, environmental magnetic noise typically also causes some time-varying noise magnetic flux to pass through core 22. The combination of time-varying magnetic flux 14A and the time-varying noise magnetic flux causes a voltage $V_I$ to be induced across coil 24.

In particular, induced voltage $V_I$ is determined from Faraday's law as:

$$V_I = -N\frac{d\Phi}{dt} \qquad (1)$$

where N is the number of turns of coil 24, $\Phi$ is the total magnetic flux through core 22, and the notation d( )/dt indicates time derivative. Letting magnetic flux 14A be represented by symbol $\Phi_C$, the total magnetic flux $\Phi$ consists additively of time-varying component $\Phi_C$ and a composite component $\Phi_N$ arising from the environmental magnetic noise. Accordingly, Eq. 1 can be modified to:

$$V_I = -N\frac{d\Phi_C}{dt} - N\frac{d\Phi_N}{dt} \qquad (2)$$

where the term $-N \cdot \Phi_C/dt$ arises from the time-varying nature of current $I_C$ or/and the movement of magnetic head 18 relative to conductor 12.

Magnetic flux $\Phi_C$ is the integral of the magnetic field $B_C$ due to current $I_C$ over a surface area S through which flux $\Phi_C$ enters or leaves core 22. That is, $$\Phi_C = \int B_C dS \qquad (3)$$

where magnetic field $B_C$ is a function of position variables x, y, and z and current $I_C$.

Let conductor 12 be characterized by xyz coordinate values $x_C$, $y_C$, and $z_C$ at a point $P_C$. For example, point $P_C$ can be the center of mass of conductor 12 in the xz plane, coordinate value $y_C$ then being zero. FIG. 1 illustrates this case. Since magnetic field $B_C$ is dependent on position variables x, y, and z, field $B_C$ is equivalently dependent on the distance away from point $P_C$.

Normally, magnetic field $B'_C$ is directly proportional to current $I_C$. Field $B_C$ can then be represented as:

$$B_C = I_C f(x-x_C, y-y_C, z-z_C) \qquad (4)$$

where $f(x-x_C, y-y_C, z-z_C)$ is a function that gives the $B_C$ spatial variation due to the geometry of conductor 12. Using Eq. 4, Eq. 3 becomes:

$$\Phi_C = \int I_C f(x-x_C, y-y_C, z-z_C) dS$$
$$I_C \int f(x-x_C, y-y_C, z-z_C) dS \qquad (5)$$

By using reasonable approximations, the integral factor in Eq. 5 can be placed in a form suitable for closed-form differentiation so as to enable magnetic flux $\Phi_C$ from Eq. 5 to be readily employed in Eq. 2.

Assume that conductor 12 is of relatively uniform cross section along its length and that magnetic head 18 overlies a portion of conductor 12 remote from the ends of conductor 12. In this case, the dependence of magnetic flux $\Phi_C$ on distance $y-y_C$ in Eq. 5 is small and can be ignored to a first approximation.

Let the approximate location at which time-varying magnetic flux $\Phi_C$ enters and leaves core 22 be represented as a point $P_H$ having the xz coordinate $x_H$ and $z_H$. In FIG. 1, point $P_H$ is shown as being at the bottom of gap 26 in core 22. Nonetheless, point $P_H$ can be at another part of air gap 26 or even at a portion of the bottom of core 22 without significantly affecting the present analysis. Referring to FIG. 1A, the lateral distance from coordinate position $x_C$ to coordinate position $x_H$ is represented generally as distance parameter $x_R$. The vertical distance from coordinate position $z_C$ to coordinate position $z_H$ is similarly represented as distance parameter $z_R$. Distance parameters $x_R$ and $z_R$ are both functions of time.

With the dependence of magnetic flux $\Phi_C$ on distance $y-y_C$ being ignored, the integral factor in Eq. 5 varies largely as a function of distance parameters $x_R$ and $z_R$—i.e., the x and z distances from point $P_C$ of conductor 12 to the approximate location $P_H$ where magnetic flux $\Phi_C$ enters and leaves core 22. Accordingly, Eq. 5 can be written as:

$$\Phi_C \approx I_C g(x_R, z_R) \tag{6}$$

where $g(x_R, z_R)$ is a function that approximately gives the spatial dependence of where magnetic flux $\Phi_C$ enters and leaves core 22 relative to the location of conductor 12.

Upon differentiating magnetic flux $\Phi_C$ in Eq. 6 with respect to time, the rate $d\Phi_C/dt$ at which magnetic flux $\Phi_C$ varies with time is given as:

$$\frac{d\Phi_c}{dt} \approx \frac{\partial \Phi_C}{\partial I_C}\frac{dI_C}{dt} + \frac{\partial \Phi_C}{\partial x_R}\frac{dx_R}{dt} + \frac{\partial \Phi_C}{\partial z_R}\frac{dz_R}{dt} \tag{7}$$

$$= g\frac{dI_C}{dt} + I_C \frac{\partial g}{\partial x_R}\frac{dx_R}{dt} + \frac{\partial g}{\partial z_R}\frac{dz_R}{dt}$$

where "∂" indicates partial derivative, and "d" indicates total derivative. In Eq 7, $dz_R/dt$ is the rate at which coordinate position $z_H$ changes or moves relative to coordinate position $z_C$. Magnetic head 18 is usually maintained at a largely constant height above conductor 12 and thus above plate structure 10. Accordingly, rate $dz_R/dt$ is approximately zero. Eq. 7 is then simplified to:

$$\frac{d\Phi_c}{dt} \approx g\frac{dI_C}{dt} + I_C \frac{\partial g}{\partial x_R}\frac{dx_R}{dt} \tag{8}$$

Substituting flux change rate $d\Phi_C/dt$ from Eq. 8 into Eq. 2 yields:

$$V_I \approx -N\left(g\frac{dI_C}{dt} + I_C \frac{\partial g}{\partial x_R}\frac{dx_R}{dt}\right) - N\frac{d\Phi_N}{dt} \tag{9}$$

The $dx_R/dt$ term in Eq. 9 is the rate at which coordinate position $x_H$ changes or moves relative to coordinate position $x_C$. The location of conductor 12 is fixed in plate structure 10. Magnetic head 18 is normally maintained in a fixed upright orientation relative to plate structure 10. Accordingly, $dx_R/dt$ also represents the rate at which head 18 moves relative to plate structure 10 in the (positive or negative) x direction. If there is little change in the y position of head 18 relative to the y position of plate structure 10 during a current-sensing period, $dx_R/dt$ also represents the relative velocity of head 18 to plate structure 10.

An induced current $I_I$ flows through coil 24. Induced current $I_I$ is proportional to induced voltage $V_I$ but differs in phase angle from voltage $V_I$. The phase angle difference depends on the design of magnetic head 18 and the head electronics.

Signal processing circuitry 20 periodically samples induced current $I_I$ and processes the sampled $I_I$ data to produce output signal information $S_O$. Specifically, circuitry 20 filters the sampled $I_I$ data to identify the $V_I$ component due to magnetic flux $\Phi_C$. The filtering operation includes adjusting for the $I_I$-to-$V_I$ phase difference. Circuitry 20 then provides output information $S_O$ at a value corresponding to magnetic flux $\Phi_C$ and thus at a value representative of the value of current $I_C$.

Signal processing circuitry 20 typically employs a least squares technique to generate the best estimate for output signal information $S_O$. When current $I_C$ is generally of a direct current ("DC") nature, output information $S_O$ is typically provided at a value directly proportional to the DC value of current $I_C$. When current $I_C$ is characterized by a repetition frequency and a time-averaged current value equal to zero or close to zero, information $S_O$ can report current $I_C$ in various ways. For example, information $S_O$ can be furnished at a value proportional to the time-averaged absolute value (e.g., root-mean-square average) of current $I_C$ or proportional to the average maximum magnitude of current $I_C$.

FIG. 1 indicates that signal processing circuitry is stationary when magnetic head 18 is moving. Nonetheless, part of circuitry 20 can be incorporated into the body that houses head 18 so as to move with head 18. Alternatively, plate structure 10 can be moving while head 18 is stationary. As a further alternative, both plate structure 10 and head 18 can be moving during a current-sensing period. The preceding analysis applies to both of these alternatives, with $dx_R/dt$ still representing the rate at which head 18 moves relative to plate structure 10 in the x direction.

Conductor 12 is typically connected in series with one or more other electrical conductors. The resulting combination of conductors has an associated (parasitic) resistance. One or more circuit elements such as. capacitors, inductors, and (real) resistors may also be connected in series and/or in parallel with the combination of conductors. Current $I_C$ is produced in conductor 12 by applying a driving voltage $V_D$ across the combination of conductors and circuit element(s). Driving voltage $V_D$ may be constant or time-varying. These two operational conditions are respectively referred to here as the constant-drive and variable-drive cases or modes.

First consider the constant-drive case. For current $I_C$ to be non-zero at constant drive voltage $V_D$, no capacitor can be in series with conductor 12. At constant drive voltage $V_D$, the voltage across any inductor in series with conductor 12 is zero. For a given value of drive voltage $V_D$, the magnitude of current $I_C$ in the constant-drive mode is thus largely determined by the sum of the parasitic resistances of the conductors and the value(s) of any real resistor(s) in series with the conductors. This composite resistance can be modeled as a resistance of fixed value $R_D$. In the constant-drive mode, current $I_C$ is thus at a constant value determined from:

$$I_C = \frac{V_D}{R_D} \tag{10}$$

For the constant-drive case, $dI_C/dt$ is zero since drive voltage $V_D$ is constant. Eq. 9 then becomes:

$$V_I \approx -NI_C \frac{\partial g}{\partial x_R}\frac{dx_R}{dt} - N\frac{d\Phi_N}{dt} \tag{11}$$

for the constant-drive mode. As an examination of Eq. 11 indicates, $dx_R/dt$ must be non-zero in the constant-drive case for current $I_C$ to be determined by sensor 16. That is, magnetic head 18 must be moving relative to plate structure 10 as head 18 passes over conductor 12. In the constant-drive mode, output signal information $S_O$ is typically provided from signal processing circuitry at a value directly representing the so-sensed $I_C$ value.

Next consider the variable-drive case in which driving voltage $V_D$ is time variable. A selected repetition frequency or period is typically associated with at least part of drive voltage $V_D$ in the variable-drive mode. For example, voltage $V_D$ can consist of a sinusoidal component imposed on a DC component in the general form of:

$$V_D = V_{D0} + V_{DA} \sin \omega_D t \tag{12}$$

where $V_{D0}$ is the DC component, $V_{DA}$ is the maximum amplitude of the sinusoid, and $\omega_D$ is the angular frequency. If a capacitor is connected in series with conductor 12, no DC current passes through the capacitor. Current $I_C$ is then typically of an alternating-current ("AC") nature for which the time-averaged value of current $I_C$ is zero.

When a selected frequency is associated with the least part of drive voltage $V_D$, largely the same frequency is normally associated with at least part of $d\Phi_C/dt$ and thus with at least part of the $V_I$ component arising from $d\Phi_C/dt$. The selected frequency—e.g., $\omega_D/2\pi$ in the sinusoidal expression represented by Eq. 12—normally appears in output signal information $S_O$. The frequency associated with voltage $V_D$ in the variable-drive case is normally chosen to be of a value significantly different from the value of any frequency associated with the environmental magnetic noise. Hence, drive voltage has a unique signature that appears in output information $S_O$. Signal processing circuitry 20 typically determines the value for current $I_C$ by filtering the sampled $I_I$ data to identify signal components at the $V_D$ signature frequency and then determining an appropriate $S_O$ current value corresponding to those signal components.

Equipment that might raise environmental magnetic noise concerns is often operated from standard power lines that provide electricity at 60 Hz in the United States and at 50 Hz in Europe. A frequency of 60 Hz or 50 Hz may thus be associated with such equipment. Accordingly, the $V_D$ signature frequency is chosen to be substantially different from both 60 Hz and 50 Hz. Although the $V_D$ signature frequency can be less than 50 Hz, the $V_D$ frequency is typically chosen to be at least 70 Hz so as to be safely above 60 Hz. The $V_D$ frequency is normally at least 100 Hz, typically 1000 Hz.

In order to see the effect of x movement on $d\Phi_C/dt$, it was assumed above that magnetic head 18 moves in the x direction relative to plate structure 10. Since the $g \cdot dI_C/dt$ term in Eq. 9 is non-zero in the variable-drive case, head 18 can normally be stationary relative to plate structure 10 during variable-drive operation so that the $I_C \cdot \partial g/\partial x_R \cdot dx_R/dt$ term in Eq. 9 is zero. Nonetheless, magnetic head 18 is normally operated so as to move in a direction transverse to the length of conductor 12 during current sensing in the variable-drive mode. Hence, $dx_R/dt$ is normally at some finite value.

The values of the parameters that determine the $V_I$ component arising from $d\Phi_C/dt$ in Eq. 9 are typically chosen in such a manner that, on the average, the $g \cdot dI_C/dt$ term is of considerably greater magnitude than the $I_C \cdot \partial g/\partial x_R \cdot dx_R/dt$ term. This choice of parameter values simplifies the filtering operation by substantially alleviating the need to account for the effect of $dx_R/dt$ in the variable-drive case. Alternatively, the components of the sampled $I_I$ data arising from the $I_C \cdot \partial g/\partial x_R \cdot dx_R/dt$ term can be removed by appropriate filtering in signal processing circuitry 20.

It was also assumed above that no significant movement of magnetic head 18 occurs in the (positive or negative) y direction relative to plate structure 10 during a current-sensing period. This assumption can be relaxed for both the variable-drive and constant-drive modes. Allowing y-direction movement of head 18 relative to plate structure 10 strictly requires that Eqs. 7–9 be modified to include a contribution arising from the rate $dy_R/dt$ of movement of head 18 relative to plate structure 10 in the y direction, where $y_R$ is the variable y distance from point $P_C$ to Point $P_H$. However, the magnitude of the $dy_R/dt$ contribution to flux-change rate $d\Phi_C/dt$ is normally very small compared to the average magnitudes of the terms involving $dI_C/dt$ and $dx_R/dt$. Consequently, head 18 can normally be moved in the y direction relative to plate structure 10 without having any significant effect on the signal processing in circuitry 20.

Primary conductor 12 is typically shaped approximately like a rectangular box. Using such an approximation, function $g(x_R, z_R)$ can be determined analytically. However, it is generally not necessary to do so for current sensor 16 to operate properly. Instead, sensor 16 can be calibrated using a reference electrical conductor which is similar to conductor 12 and through which a known (typically time-varying) current passes.

Figure 2:
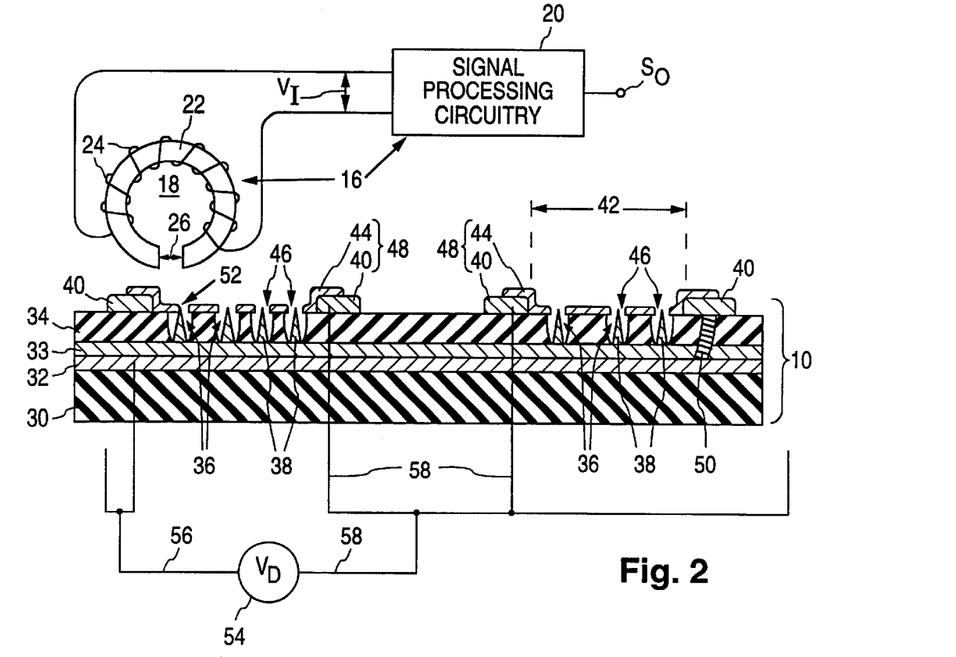
FIG. 2 is a schematic diagram that illustrates how the sensor of FIGS. 1A and 1B is employed to magnetically sense current in a baseplate structure of a gated flat-panel CRT display. A side cross-sectional view of part of the baseplate structure is presented in FIG. 2.

Current sensor 16 is particularly suitable for sensing currents that arise from short circuit defects in matrix-addressed plate structures. FIG. 2 illustrates how sensor 16 is employed in sensing short circuit currents when plate structure 10 constitutes a baseplate structure of a matrix-addressed gated field-emission flat-panel CRT display.

Baseplate structure 10 in the field-emission display (again, "FED") of FIG. 2 is created from a flat electrically insulating baseplate 30. A group (or level) of parallel laterally separated emitter row electrodes 32, one of which is shown in FIG. 2, lie on the upper (interior) surface of baseplate 30. A highly resistive layer 33 is situated on emitter row electrodes 32.

An inter-electrode dielectric layer 34 lies on resistive layer 33. Multiple laterally separated sets of dielectric openings 36 extend through dielectric layer 34 down to resistive layer 33 at locations above row electrodes 32. Corresponding electron-emissive elements 38, shown here as being conical in shape, are respectively situated in dielectric openings 36. Consequently, electron-emissive elements 38 are divided into multiple laterally separated sets of electron-emissive elements. A row of the sets of electron-emissive elements 38 are electrically coupled through resistive layer 33 to a corresponding one of row electrodes 32. Resistive layer 33 provides a resistance of at least $10^6$ ohms, typically $10^{10}$ ohms, between each electron-emissive element 38 and the underlying row electrode 32.

Each set of electron-emissive elements 38 is located in a display region that defines (a) a different pixel when the FED is a black and white display or (b) a different sub-pixel when the FED is a color display. A color pixel is formed with three sub-pixels, one for red light, another for green light, and the third for blue light.

Baseplate structure 10 in FIG. 2 contains a group (or level) of parallel laterally separated column control electrodes 40 extending over dielectric layer 34 generally perpendicular to emitter row electrodes 32. Two of control electrodes 40 are shown in FIG. 2. Each of control electrodes 40 has a plurality of large control openings 42 respectively corresponding to row electrodes 32. Each control opening 42 is situated over corresponding row electrode 32 at the general location for a pixel (in the case of a black and white display) or a sub-pixel (in the case of a color display).

One or more electrically conductive gate portions 44 are situated on each control electrode 40 and extend into its control openings 42 down to inter-electrode dielectric layer 34. Instead of extending over control electrodes 40, gate portions 44 could extend under electrodes 40. Openings 46 extend through gate portions 44 within control openings 42 to expose electron-emissive elements 38. The tip of each electron-emissive element 38 normally extends at least partway through its gate opening 46. The combination of each control electrode 40 and the adjoining gate portion or portions 44 forms a composite column electrode 48.

Processes for fabricating baseplate structure 10 in FIG. 2 are described in Haven et al., U.S. patent application Ser. No. 08/660,536, filed Jun. 7, 1996, now U.S. Pat. No. 6,187,603 the contents of which are incorporated by reference herein. U.S. Pat. Nos. 5,462,467, 5,559,389, and 5,564,959 describe other processes that can be employed in manufacturing baseplate structure 10.

When baseplate structure 10 is fabricated in the desired manner, each composite column electrode 48 is nominally electrically separated from each row electrode 32, including electron-emissive elements 38 formed above that row electrode 32. The electrical separation is accomplished with dielectric layer 34 and with the air gaps between gate portions 44 and electron-emissive elements 38.

Short circuit defects are sometimes produced in baseplate structure 10 during FED fabrication before structure 10 is sealed to a suitable faceplate structure, typically through an annular outer wall. A short circuit defect is formed by an electrically conductive path extending from one of column electrodes 48 through dielectric layer 34 down to one of row electrodes 32 as indicated schematically by item 50 in FIG. 2. Using suitable optical equipment, markings that characterize this type of short circuit defect are usually visible at the upper surface of baseplate structure 10.

Occasionally, one of electron-emissive elements 38 becomes electrically connected to gate portion 44 of corresponding column electrode 48. If resistive layer 33 were absent, such an electrical connection might be classified as a short circuit. However, due to the high resistance that layer 33 provides between row electrodes 32 and overlying electron-emissive elements 38, the amount of current that can flow through each column electrode 48 due to one of its electron-emissive elements 38 being connected to associated gate portion 44 is extremely small compared to the current that flows through a direct short circuit such as that represented by conductive material 50. Accordingly, electrical connection of gate portion 44 to one of its electron-emissive elements 38 is here not considered to be a short circuit defect.

Current sensor 16 is part of a system that searches for short circuit defects in accordance with the invention. The system includes a source 54 of driving voltage $V_D$ coupled between all of composite column electrodes 48, on one hand, and all of row electrodes 32, on the other hand. Electrical conductor 56 in FIG. 2 couples row electrodes 32 to one terminal of $V_D$ source 54. Electrical conductor 58 couples column electrodes 48, specifically electrodes 40, to the other terminal of source 54. A system ammeter (not separately shown) is preferably incorporated into, or placed in series with, source 54 to give the total current flowing through baseplate structure 10—i.e., through electrodes 32 or 48 as a group—when drive voltage $V_D$ is applied across structure 10.

Figure 3:
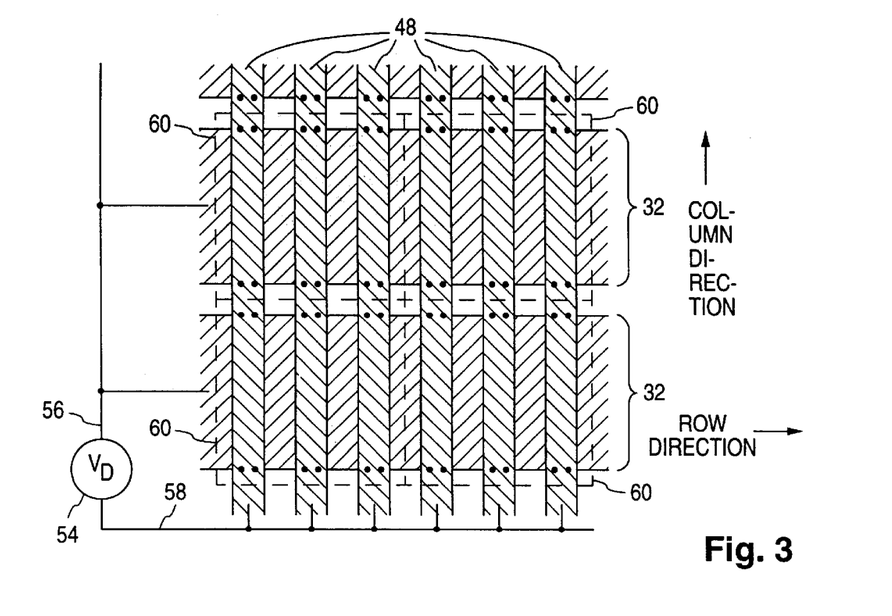
FIG. 3 is a plan view of part of the baseplate structure in FIG. 2.

FIG. 3 depicts, in plan view, an example of how driving voltage $V_D$ is applied to electrodes 32 and 48 in a color embodiment of the FED. For simplicity, electrodes 32 and 48 are illustrated as straight strips in FIG. 3 without showing any of their internal details. In particular, FIG. 3 does not illustrate any variation in width or waviness that may be actually present in electrodes 32 or 48.

The location of four exemplary square color pixels 60, each having one row electrode 32 is marked out in dashed line in FIG. 3. Each square pixel 60 contains three rectangular color sub-pixels (not specifically indicated in FIG. 3) for emitting electrons that respectively cause red, green, and blue light to be emitted from light-emitting regions contained in the FED's faceplate structure. Each sub-pixel has one column electrode 48.

Electrical conductor 56 is specifically connected to the ends of row electrodes 32 along one of the FED's sides (the left side in FIG. 3) near where row drivers (not shown) connect to electrodes 32. The ends of row electrodes 32 along the FED's opposite side (the right side in FIG. 3) are typically left open. Electrical conductor 58 is similarly connected to the ends of column conductors 48 along one of the FED's remaining two sides (the bottom side in FIG. 3) near where column drivers (likewise not shown) connect to electrodes 48. The ends of column electrodes 48 along the FED's opposite side (the top side in FIG. 3) are typically left open. Should a short circuit defect arise between one of row electrodes 32 and one of column electrodes 48, current $I_C$ flows through that pair of electrodes 32 and 48 and through any electrically conductive material that short circuits those two electrodes 32 and 48.

Alternatively, conductor 56 can be split into two electrical conductors. Certain of row electrodes 32 are connected to one of these conductors along one of the FED's sides while the remainder of electrodes 32 are connected to the other conductor along the FED's other side. The same applies to conductor 58 with respect to column electrodes 48.

In a typical FED volume-production environment, only a fraction of baseplate structures 10 would normally be expected to have short circuit defects in the active area. Rather than utilizing sensor 16 to examine all of baseplate structures 10 for short circuit defects, it is often more efficient to utilize another technique to make a preliminary determination as to which structures 10 are free of short circuit defects. For example, the system ammeter in series with, or incorporated into, voltage source 54 can be employed to determine how much total current (if any) flows between row electrodes 32, on one hand, and column electrodes 48, on the other hand, in each structure 10. If no current sufficiently high to indicate the presence of at least one short circuit defect is detected by the ammeter, the baseplate structure 10 under test can be classified as having no active-area short circuit defect. Sensor 16 is then employed in locating short circuit defects in the active areas of those baseplate structures 10 not found to be free of short circuit defects.

Sensing of short circuit currents with sensor 16 is performed by scanning magnetic head 18 over the upper surface of baseplate structure 10. For the purpose of examining the scanning operation, let the direction along the rows of pixels in the FED be referred to as the row direction, while the direction along the columns of pixels is referred to as the column direction. The scanning is done by moving head 18 one or more times across structure 10 in one of these two directions and then moving head 18 one or more times across structure 10 in the other direction. The scanning is normally done-in the display's peripheral area over the ends of electrodes 32 and 48 to reduce the risk of damaging the display's active area where column electrodes 48 cross over row electrodes 32. Data for identifying short-circuit defects is thus gathered on any currents that flow through electrodes 32 and 48. During a current-sensing period, each of electrodes 32 and 48 in FIG. 2 or 3 thus corresponds to primary conductor 12 in FIG. 1.

To understand a typical scanning operation more fully, consider the situation in which the initial part of the scanning is done in the row direction and the remainder of the scanning is done in the column direction. The scanning in the row direction over baseplate structure 10 is performed over a peripheral-area (row) strip situated between the location where conductor 58 attaches to column electrodes 48 and the particular row electrode 32 closest to the column-electrode attachment points. In FIG. 3, the row-direction scan is thus done over a strip below the lower of illustrated row electrodes 32. Magnetic head 18 crosses the width of each column electrode 48 during the row-direction scan. As a result, sensor 16 senses any current flowing through each of column electrodes 48. The location sensor in current sensor 16 also collects information to identify the location of each column electrode 48 as it is examined. In some cases, the row-direction scan need only be performed across certain of column electrodes 48.

Similar to the row-direction scan, the scanning in the column direction over baseplate structure 10 is performed over a peripheral-area (column) strip situated between where conductor 56 attaches to row electrodes 32 and the particular column electrode 48 closest to the row-electrode attachment points. In FIG. 3, the column-direction scan is thus done over a strip to the left of illustrated column electrodes 48. During the column-direction scan, magnetic head 18 crosses the width of each row electrode 32. Consequently, sensor 16 detects any current flowing through each of row electrodes 32. The location detector again collects information to identify the location of each row electrode 32 as it is being examined. In some cases, the column-direction scan need only be performed across certain of row electrodes 32.

The foregoing scan procedure is employed in both the constant-drive mode (drive voltage $V_D$ is constant) and the variable-drive mode (voltage $V_D$ is time variable). The same procedure is also followed when the row scanning is performed before the column scanning, subject to reversing the steps described in the preceding two paragraphs. One or more additional (partial or complete) scans can be made in the row direction and/or the column direction at the indicated locations to gather further data for improving the accuracy of the short circuit defect detection. The scanning speed can be varied to control sensitivity.

No current flows through the unconnected ends of electrodes 32 and 48—i.e., through the ends of electrodes 32 and 48 opposite to where they are respectively connected to conductors 56 and 58. To the extent that baseplate structure 10 has at least one short circuit defect, performing the row-direction and column-direction scans at the indicated locations (i.e., closest to where conductors 56 and 58 are attached respectively to electrodes 32 and 48) ensures that current going through each short circuit defect is sensed in both the row and column directions regardless of whether drive voltage $V_D$ is constant or variable.

Alternatively, conductor 56 can be connected to both ends of each row electrode 32. Likewise, conductor 58 can be connected to both ends of each column electrode 48. Connecting conductors 56 and 58 to electrodes 32 and 48 in this manner provides flexibility in choosing the location for the row and column scans at the expense of adding additional hookups to electrodes 32 and 48.

During each current-sensing scan period, signal processing circuitry 20 samples induced current $I_I$ at a selected rate and processes the $I_I$ samples. Processing circuitry 20 correlates the processed data to produce output signal information $S_O$ as a function of the distance in the row or column direction and thus as a function of the column-electrode or row-electrode numbers. When two or more scans are performed over the same row-direction or column-direction strip, circuitry 20 also combines the data from the separate scans to generate output information $S_O$ as a composite of the total data gathered. Output information $S_O$ is generally indicative of the current, if any, flowing through each of electrodes 32 and 48. In addition, the system ammeter determine how much total current flows through baseplate structure 10.

The $S_O$ data is analyzed to determine the number and locations of short circuit defects in the active area of baseplate structure 10. This normally entails processing the $S_O$ data to generate one or more sets of numbers that give the probabilities of short circuit defects being at certain of the crossings of a row electrode 32 and a column electrode 48. The electrode-crossing (or cross-over) locations for which short circuit defect probabilities are determined during the $S_O$ data processing usually include every electrode-crossing location having a high probability of a short circuit defect. For an electrode-crossing location at which a short circuit defect almost certainly exists, the probability is close to one. The probability is close to zero at an electrode-crossing location where a short circuit defect almost certainly does not exist.

Analysis of the $S_O$ data to determine the number and location of short circuit defects in baseplate structure 10 is normally performed automatically in signal processing circuitry 20 directly after generation of the $S_O$ data. For this purpose, processing circuitry 20 contains a suitably programmed computer that operates in the manner described below to generate short circuit defect location probabilities. This permits repair of short circuit defects to be initiated almost immediately after the scanning operation with magnetic head 18 is completed. Alternatively, the $S_O$ short circuit data analysis can be decoupled from the current-sensing function performed by head 18. The short circuit determination is then conducted at a later time and/or with separate electronics from those in processing circuitry 20. In either case, short circuit defect repair is typically performed in the course of generating the short circuit defect location probabilities.

Figure 4:
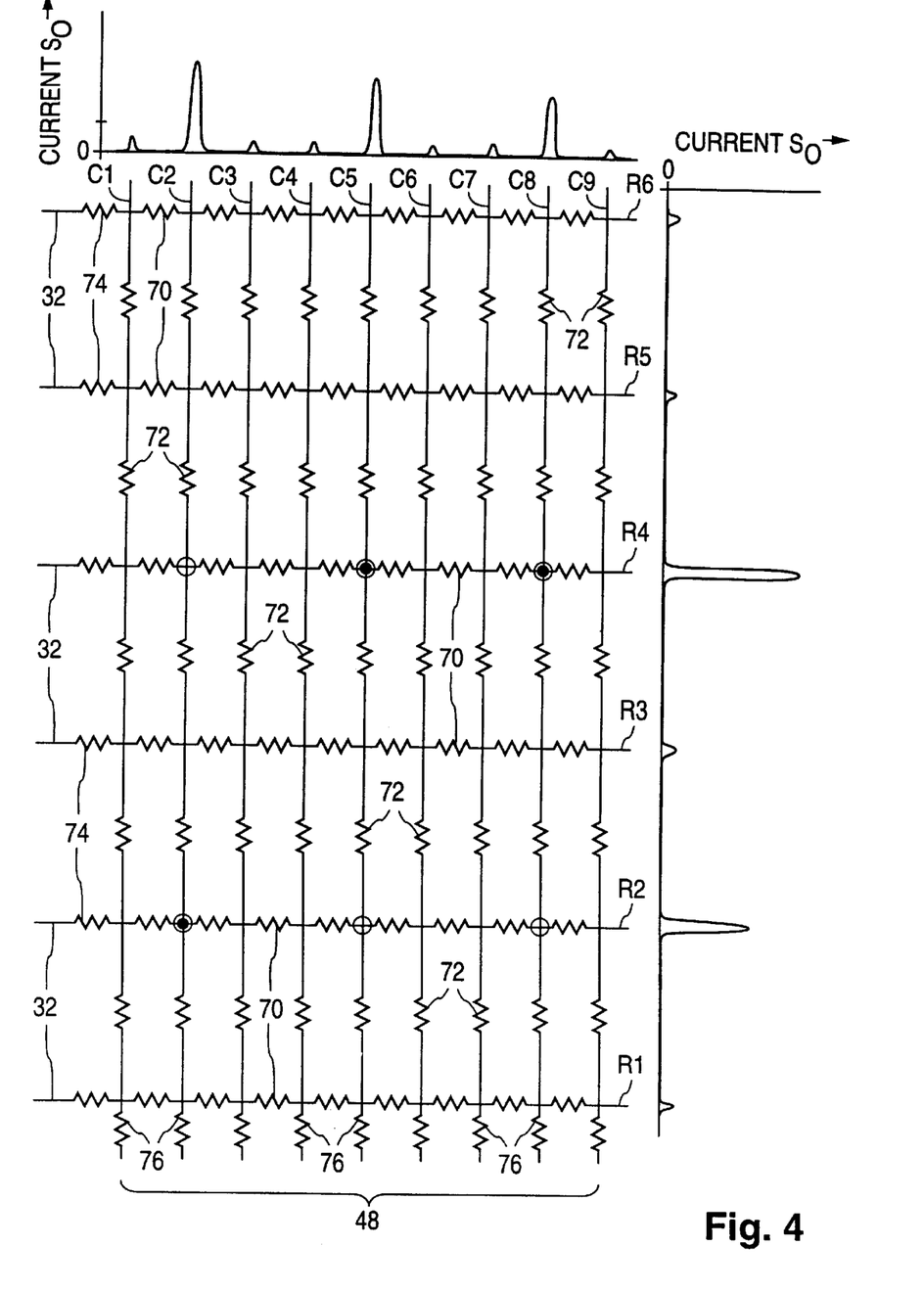
FIG. 4 is a composite view of (a) part of the crossing electrodes in the baseplate structure of FIG. 2 and (b) an exemplary graphical representation of current sensed in those electrodes.

An understanding of how the probability technique is employed in determining the locations and number of short circuit defects is facilitated with the assistance of FIG. 4 in which a portion of the active area of baseplate structure 10 is schematically depicted. FIG. 4 also shows a simplified exemplary graphical breakout of the $S_O$ data for the illustrated active area portion.

The crossing lines in FIG. 4 represent six row electrodes 32, further labeled R1–R6, and nine column electrodes 48, further labeled C1–C9. The example of FIG. 4 represents the situation in which the left ends of row electrodes 32 are connected to conductor 56, and the lower ends of column electrodes 48 are connected to conductor 58. Accordingly, lowest-number column electrode C1 is the column electrode 48 closest to where conductor 56 is attached to row electrodes 32. Likewise lowest-numbered row electrode R1 is the row electrode 32 closest to where conductor 58 is attached to column electrodes 48.

Each of electrodes 32 and 48 has a small parasitic resistance per unit length, referred to here as distributed conductor resistance. In FIG. 4, the distributed conductor resistance for row electrodes 32 is represented by equal-value row-electrode resistors 70 located in the row-electrode sections between consecutive column electrodes 48. The distributed conductor resistance for column electrodes 48 is represented by equal-value column-electrode resistors 72 located in the column-electrode sections between consecutive row electrodes 32.

With conductor 56 (not shown in FIG. 4) connected to the left ends of row electrodes 32, equal-value row-electrode resistors 74 represent the distributed conductor resistance associated with the portions of row electrodes 32 situated to the left of column electrode C1. With conductor 58 (likewise not shown in FIG. 4) connected to the bottom ends of column electrodes 48, equal-value additional column-electrode resistors 76 represent the distributed conductor resistance associated with the portions of column electrodes 48 situated below row electrode R1. Additional resistors 74 and 76 also respectively include any resistances associated with connecting row electrodes 32 to conductor 56 and with connecting column electrodes 48 to conductor 58.

Some parasitic resistance is present at the actual site of a short circuit defect. The on-site short circuit resistance varies significantly with the particular characteristics of the defect. However, the on-site short circuit resistance is normally small compared to distributed conductor resistances 70, 72, 74, and 76. Specifically the on-site short circuit resistance is invariably less than 500 ohms and normally appears to be no more than 5 ohms, typically 3 ohms. To a good approximation, the on-site short circuit resistance can be ignored in establishing the expected short circuit currents through potential short circuit defects at electrode-crossing locations.

Due to distributed conductor resistances 70, 72, 74, and 76, the value of the current flowing through a short circuit defect depends on the location of the defect in the FED's active area. For example, assume that a short circuit defect exists at the crossing of row electrode R1 and column electrode C1—i.e., at the illustrated electrode-crossing location closest to where conductors 56 and 58 are attached to electrodes 32 and 48. Current flowing through the current path for a short circuit at the R1/C1 crossing encounters lower total distributed conductor resistance than current flowing through the current path for a short circuit at any other electrode-crossing location in FIG. 4. Accordingly, the average magnitude of the R1/C1 short circuit current is normally higher than the average magnitude of the short circuit current flowing through a short circuit defect at any other electrode-crossing location in the illustrated active area portion.

Conversely, consider what happens if a short circuit defect occurs at the crossing of row electrode R6 and column electrode C9—i.e., the illustrated electrode-crossing location furthest from where conductors 56 and 58 are attached to electrodes 32 and 48. The current flowing through the current path for a short circuit defect at the R6/C9 crossing encounters more total distributed conductor resistance than current flowing through the current path for a short circuit at any other electrode-crossing location in FIG. 4. The average magnitude of the R6/C9 short circuit current is thus normally lower than the short circuit current flowing through a short circuit defect anywhere else in FIG. 4.

The concept of candidate locations for short circuit defects is helpful in understanding how the $S_O$ current data, such as that shown in FIG. 4, is analyzed to determine the locations and number of short circuit defects. A candidate location for a short circuit defect is an electrode-crossing location where a row electrode 32 carrying a sensed current sufficient in value for at least one short circuit defect crosses a column electrode 48 likewise carrying a sensed current sufficient in value for at least one short circuit defect. From a probability viewpoint, candidate locations for short circuit defects are electrode-crossing locations where the probabilities of short circuit defects are high compared to the probabilities of short circuit defects at the other electrode-crossing locations Note that signal processing circuitry 20 does not actually identify any candidate short circuit defect locations. Instead, processing circuitry 20 generates short circuit defect probabilities.

The number of candidate locations for short circuit defects is the product of (a) the number $M_R$ of row electrodes 32 that each carry sensed current great enough for at least one short circuit defect and (b) the number $M_C$ of column electrodes 32 that each likewise carry sensed current great enough for at least one short circuit defect. In the example of FIG. 4, $M_R$ is 2 while $M_C$ is 3. Since the product $M_R M_C$ is 6, there are six candidate locations for short circuit defects in FIG. 4. Each candidate location for a short circuit defect is represented by a circle in FIG. 4.

The actual number of short circuit defects ranges from the greater of $M_R$ and $M_C$ up to $M_C$, the number of candidate locations for short circuit defects. For any given number $M_R M_C$ of candidate locations, the actual number of short circuit defects is usually closer to the minimum number, i.e., the greater of $M_R$ and $M_C$, rather than the maximum number $M_R M_C$. FIG. 4 illustrates three actual short circuit defects, each represented by a solid dot.

The graph in the upper part of FIG. 4 presents an example of how the $S_O$ current data appears for scanning in the row direction across column electrodes C1–C9. The highest three current peaks in the upper graph represent the sensed current data for column electrodes C2, C5, and C8. The graph in the right-hand part of FIG. 4 presents an example of how the $S_O$ data appears for scanning in the column direction across row electrodes R1–R6. The highest two current peaks in the right-hand graph represent the sensed current data for row electrodes R2 and R4. Each of these five high current peaks is sufficiently great to be a short circuit current for at least one short circuit defect.

FIG. 4 indicates that currents of lower magnitude are sensed on the remainder of electrodes 32 and 48. Each of these small currents is insufficient for a short circuit defect. Nonetheless, these small currents typically must be considered in analyzing the $S_O$ current data to determine the number and locations of the short circuit defects. Noise is typically the primary reason for the appearance of these small currents.

For each actual short circuit defect, largely all of the short circuit current flowing through the defect is expected to flow through both of the pair of electrodes 32 and 48 that define the location of the defect. In other words, approximately equal currents normally flow through the pair of electrodes 32 and 48 whose crossing defines the defect location. Either or both of the pair of short-circuited electrodes 32 and 48 may carry current beyond that flowing through the short circuit defect depending on whether that row electrode 32 is short circuited to one or more other column electrodes 48 or/and that column electrode 48 is short circuited to one or more other row electrodes 32.

Signal processing circuitry 20 begins the $S_O$ data analysis by locating the highest value of sensed row current in order to identify the particular row electrode 32 carrying the highest sensed current since that electrode 32 is very likely to have at least one short circuit defect. Let i represent the row number of the so-identified row electrode 32. Circuitry 20 then employs the following formula to calculate the probability $P_{ij}$ that a short circuit defect exists at each location where row electrode i carrying the highest sensed row current $I_{Ri}$ crosses one of column electrodes 48:

$$P_{ij} = \frac{e^{-(I_{Ri}-I_{Cj})^2/2\sigma_{Cj}^2}}{\sum_{k=1}^{K} e^{-(I_{Ri}-I_{Ck})^2/2\sigma_{Ck}^2}} \quad (13)$$

where j sequentially represents the column number of each column electrode 48, $I_{cj}$ is the sensed column current flowing through column electrode j, $\sigma_{cj}$ is the root-mean-square average magnitude of additive noise on column electrode j, k is a running integer for column electrodes 48, K is the total number of column electrodes 48, $I_{Ck}$ is the current sensed to flow through each column electrode k, and $\sigma_{Ck}$ is the root-mean-square average magnitude of additive noise on each column electrode k.

Additive noise $\sigma_{Ck}$ for each column electrode k is measured by scanning baseplate structure 10 with magnetic head 18 while drive voltage $V_D$ is set at zero. The $\sigma_{Ck}$ value can change after a short defect is repaired to account for the uncertainty in the current flowing through the defect. This is mitigated when the system ammeter is very sensitive.

Signal processing circuitry 20 ascertains the highest of probabilities $P_{ij}$ calculated in this probability analysis stage in order to identify the corresponding column electrode j. The location at which row electrode i carrying the highest sensed row current crosses column electrode j having the highest probability $P_{ij}$ is then classified as being most probable of having a short circuit defect. The so-classified electrode-crossing location is then optically inspected to determine whether it has characteristics of a short circuit defect. If so, an effort is undertaken to repair the short circuit defect expected to exist at this electrode-crossing location. A repair effort may also be undertaken if the identified electrode-crossing does not have characteristics of a short circuit defect.

As an examination of Eq. 13 indicates, the electrode-crossing location identified as being most probable of having a short circuit defect is the one for which column electrode current $I_{Cj}$ is the closest to row-electrode current R1. Nonetheless, the value of probability P$ij$ at this location is an important consideration in performing the repair procedure. If the $P_{ij}$ value is considerably higher than any other $P_{ij}$ value for row electrode i carrying the highest sensed row current R1 more time can be allocated to optically examining the identified electrode-crossing location than in the case where probability $P_{ij}$k at the identified location is not much greater than the $P_{ij}$ value for at least one other electrode-crossing location along that row conductor i.

After the repair effort at the electrode-crossing location having the highest probability of a short circuit defect is complete, the total current through baseplate structure 10 is normally checked with the system ammeter. If the magnitude of the total current is reduced by an amount generally corresponding to the short circuit current anticipated to flow through the short circuit defect at the location of repair, the short circuit defect is considered to have existed, and to have been repaired, at that location. Signal processing circuitry 20 then updates the current-flow data to reflect a state in which no short circuit defect is present at the location of repair. This typically includes subtracting an expected value of the short circuit current from the sensed values of the currents flowing through electrodes i and j whose crossing forms the now-repaired location. Circuitry 20 updates the short circuit defect probabilities for that row electrode i in accordance with Eq. 13.

If the magnitude of the total current through baseplate structure 10 is not reduced by a suitable amount corresponding to the anticipated value of the short circuit current, the location of repair is typically considered not to have a short circuit defect. Since no short circuit defect is determined to have existed at the location of repair, the sensed values of the currents flowing through electrodes i and j that define the investigated location are not reduced by the value of the anticipated short circuit current. Signal processing circuitry 20 does, however, utilize Eq. 13 to update the short circuit defect probabilities for that row electrode i to reflect the non-existence of a short circuit defect at the electrode-crossing location where short circuit repair was attempted. In this case, the term for column electrode j (i.e., the term for which k equals j) is deleted from the summation in the denominator of Eq. 13.

After the preceding activities are completed in whichever situation arises, signal processing circuitry 20 examines the resulting current-flow data to determine whether at least one more short circuit defect appears to be present. In particular, circuitry 20 operates in the foregoing manner to identify the row electrode 32 now having the highest value of sensed row current. A determination is performed to ascertain whether this row current value is high enough for at least one more short circuit defect. Circuitry 20 preferably makes the preceding determination by comparing the highest remaining row current to a fixed threshold current value adequate for a single (very weak) short circuit defect.

Should no further short circuit defect appear to be present, the $S_O$ data analysis is complete.

If baseplate structure 10 appears to have at least one more short circuit defect, signal processing circuitry 20 begins a new stage of the probability analysis procedure. Circuitry 20 employs Eq. 13 to compute the probability $P_{ij}$ of a short circuit defect at each location where row electrode 32 with the now highest row current value crosses each column electrode 48. The electrode-crossing location with the highest so-computed probability is classified as now being most probable of having a short circuit defect.

The newly identified electrode-crossing location is optically examined to determine whether it has short circuit defect characteristics. If so, a defect repair effort is performed at this location, followed by a total current check. As before, a defect repair effort and total current check may be done if the newly identified location does not optically appear to be a short circuit defect. If the total current is reduced an amount corresponding to the expected value of the short circuit current in either case, the newly identified electrode-crossing location is deemed to have existed, and to have been repaired, at that location. The current data is updated. In addition, the probabilities for a short circuit defect along the row electrode 32 having the newly identified defect location are updated.

The foregoing procedure is subsequently repeated, normally until the number and locations of all short circuit defects are ascertained. When the last total current check makes it clear that no further short circuit defect is present in baseplate structure 10, there is normally no need to perform further probability/current-flow update.

The probability analysis procedure works well when there is only one short circuit defect and when there are multiple short circuit defects but they are all located along only one row electrode 32 or along only one column electrode 48. The probability analysis procedure also works well in most of the more complex cases where there are short circuit defects along two or more row electrodes 32 and along two or more column electrodes 48.

In the more complex cases Where there are short circuit defects along two or more row electrodes 32 and along two or more column electrodes 48, the occurrence of multiple short circuit defects along one row electrode 32 can strain the current probability analysis procedure. FIG. 4 depicts an example of this situation. Since (a) row electrode R4 has the highest row current and (b) column electrode C2 has the highest column current and thus has the column current closest to the R4 current, use of the probability analysis procedure leads to an initial determination that the highest probability of a short circuit defect occurs at the location where row electrode R4 crosses column electrode C2. As FIG. 4 shows, the R4/C2 electrode-crossing location does not have a short circuit defect.

An alternative procedure that can be employed to determine the number and locations of all the short circuit defects to a high degree of certainty in the simple cases and in some of the more complex cases is to appropriately match the values of the sensed row-electrode currents to the values of the sensed column-electrode currents, taking into account the effects of the distributed conductor resistances represented by resistors 70, 72, 74, and 76. This current-matching procedure can be used to supplement the probability analysis technique. In performing the current-matching technique, the on-site parasitic resistance at each potential short circuit defect is typically initially assumed to be no more than 5 ohms. Inasmuch as the on-site resistance is normally small compared to the distributed conductor resistance, the on-site resistance for all the possible short circuit defects is neglected in a first-round determination of the number and location of the actual short circuit defects.

Current matching takes advantage of conservation of current. That is, the total current flowing through row electrodes 32 substantially equals the total current flowing through column electrodes 48, subject to noise.

To see how the current matching technique works, consider the simple case in which only one row electrode 32 and only one column electrode 48 have sensed current sufficient in value for a short circuit defect. If the values of the currents on the identified pair of electrodes 32 and 48 are sufficiently close, the likelihood of short circuit defect at the crossing of that pair of electrodes 32 and 48 is very high. The location is then classified as having a short circuit defect. Visual inspection with suitable optical equipment can be performed to verify the presence of a short circuit defect at the identified crossing.

Next consider the case in which precisely one row electrode 32 has sensed current sufficient for at least one short circuit defect, whereas two or more column electrodes 48 have sensed current sufficient for a short circuit defect. All of the candidate locations for short circuit defects thus occur along the so-identified row electrode 32.

The values of the sensed currents for the so-identified row electrode 32 and the two or more so-identified column electrodes 48 are examined. If the sums of the values of the sensed currents for the identified column electrodes 48 are sufficiently close to the value of the sensed current for the identified row electrode 32, the likelihood of having a short circuit defect at each of the locations where the. identified row electrode 32 crosses the identified column electrode 48 is very high. Each of the identified electrode-crossing locations is then classified as having a short circuit defect. The converse of this procedure is utilized when only one column electrode 48 has sensed current sufficient for at least one short circuit defect while each of two or more row electrodes 32 has sensed current sufficient for a short circuit defect. Visual inspection can again be performed to verify that short circuit defects are indeed present at each of the identified electrode-crossing locations.

Now consider the example of FIG. 4 in which currents sufficient for at least one short circuit defect are sensed on two or more row electrodes 32 and on two or more column electrodes 48. Assume that the current sensed on row electrode R2 is sufficient for one short circuit defect but not for two short circuit defects. The current sensed on row electrode R4 is greater than the sensed R2 current but not twice the sensed R2 current. Since row electrode R4 is current-wise further away than row electrode R2 from where conductor 58 attaches to column electrodes 48, any short circuit current that flows through one of column electrodes 48 to row electrode R4 encounters more distributed conductor resistance than short circuit current flowing through that column electrode 48 to row electrode R2. Accordingly, the sensed R4 current is sufficient for two short circuit defects. In a first-round determination, the likelihood that row electrode R2 has one short circuit defect is very high. Likewise, the likelihood that row electrode R4 has two short circuit defects is very high. The total number of short circuit defects thus appears to be three.

The values of the sensed currents on row electrodes R2 and R4 in FIG. 4 are compared to the values of the sensed currents on column electrodes C2, C5, and C8. Among the sensed C2, C5, and C8 currents, the value of the sensed C2 current is closest to that of the sensed R2 current. This establishes a moderately high likelihood that one of the three short circuit defects is located at the crossing of electrodes R2 and C2. Inasmuch as only two short circuit defects remain and row electrode R4 has two short circuit defects, a moderately high likelihood is likewise established that the remaining two short circuit defects are at the locations where row electrode R4 crosses column electrodes C5 and C8. This is the exemplary situation depicted in FIG. 4.

As indicated above, the row current data strongly suggests that row electrode R4 has two short circuit defects and that row electrode R2 has one short circuit defect. However, there is inherently some measurement error in using magnetic head 18. Although FIG. 4 illustrates the exemplary situation in which the short circuit defect on row electrode R2 actually occurs where it crosses column electrode C2, analysis of the row and column current data leads to the finding of a significant likelihood that the short circuit defect on row electrode R2 occurs where it crosses column electrodes C5 or C8. Based on the current data depicted in FIG. 4, the likelihood of the R2 short circuit defect occurring where row electrode R2 crosses column electrodes C5 or C8 is less than the likelihood of the R2 short circuit defect occurring at the R2/C2 crossing, but is not negligible.

The presence of multiple short circuit defects on one of row electrodes 32 and on one of column electrodes 48 can occasionally create difficulty in non-ambiguously ascertaining the locations of the short circuit defects. The worst-case scenario in such a situation, as exemplified in FIG. 4, may involve optically examining, and possibly attempting short circuit repair at, several electrode-crossing locations that do not have short circuit defects.

One technique that can be used to assist the probability analysis or current-matching technique in handling more complex cases, such as that shown in FIG. 4, is to perform additional scanning with magnetic head 18 in the row and column directions over selected strips of the active area. Typically, a row-direction scan is done along a (row-direction) strip between each pair of row electrodes 32 having sensed currents that are each sufficient for at least one short circuit defect, while a column-direction scan is similarly performed along a (column-direction) strip between each pair of column electrodes 48 having sensed currents that are each sufficient for at least one short circuit defect. Multiple scans along the same strips can be done to improve reliability. Aside from the case in which there are multiple short circuit defects along one of row electrodes 32 or/and one of column electrodes 48, operating in this manner typically provides data adequate to uniquely locate each short circuit defect.

In some situations, information adequate to uniquely identify and locate each short circuit defect may be produced before all of the additional scanning is completed. Part or all of one or more of the row- direction and column-direction scans may be deleted. Furthermore, the additional scanning need only be performed across the particular electrodes 32 and 48 that each carry sensed current sufficient for at least one short circuit defect.

Application of the additional scanning technique to the example of FIG. 4 is helpful in understanding how the technique provides information for locating the short circuit defects. In FIG. 4, particular scans that can be performed according to this technique include a row-direction scan over a strip between row electrodes R2 and R4, a column-direction scan over a strip between column electrodes C2 and C5, and a column-direction scan over a strip between column electrodes C5 and C8.

Assume that the row-direction scan is performed first. The row-direction scan need only cross column electrodes C2, C5, and C8. The result of the row-direction scan is that current sufficient for at least one short circuit defect is sensed on column electrodes C5 and C8 but not on column electrode C2. Consequently, a short circuit defect exists at the location where column electrode C2 crosses row electrode R2 but not where column electrode C2 crosses row electrode R4. Also, short circuit defects exist at the locations where row electrode R4 crosses column electrodes C5 and C8. The status of the locations where row electrode R2 crosses column electrodes C5 and C8 is indeterminate at this stage.

Next, let a column-direction scan be performed between column electrodes C2 and C5. This column-direction scan need only cross row electrode R2. The result of this column-direction scan is that current sufficient for at least one short circuit defect is not sensed on row electrode R2. Accordingly, no short circuit defect is present at the location where row electrode R2 crosses column electrode C5 or C8. The number and locations of all the short circuit defects have now been ascertained. There are three actual defects at the locations indicated in FIG. 4. There is no need to perform the column-direction scan between column electrodes C5 and C8.

Figure 5A:
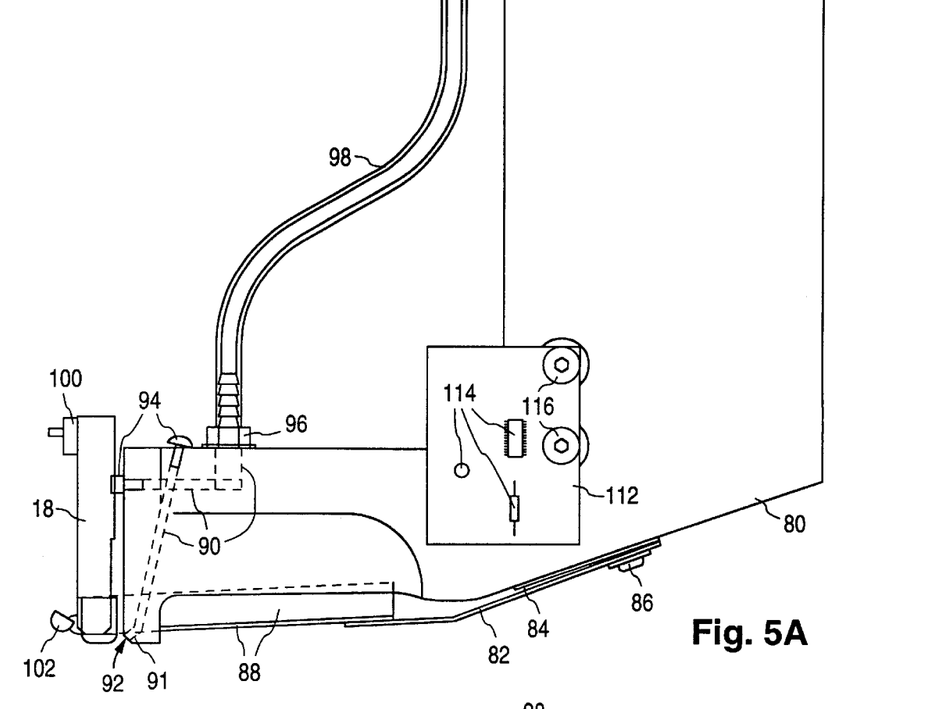
FIGS. 5A, 5B, 5C, and 5D respectively are side, front, top, and bottom views of an embodiment of part of a magnetically based current sensor configured according to the invention.
Figure 5B:
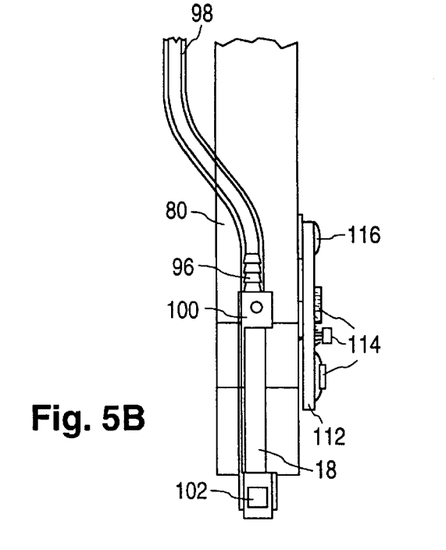
Figure 5C:
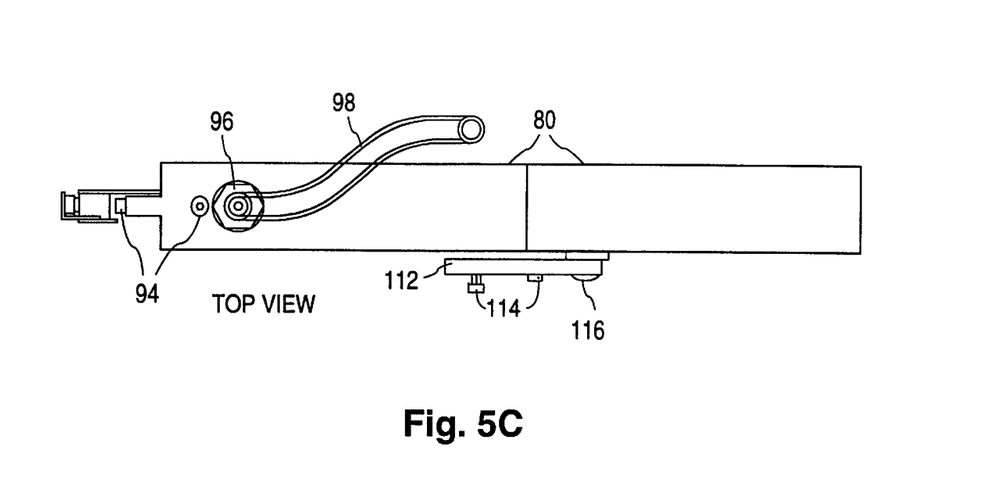

FIGS. 5A–5D (collectively "FIG. 5") respectively present side, front, top, and bottom views of an apparatus that forms part of current sensor 16. The apparatus in FIG. 5 contains magnetic head 18. FIG. 5 only shows the exterior housing of head 18. As indicated in FIGS. 5A and 5B, the housing of head 18 is elongated in the vertical direction. An opening through the bottom of the housing below gap 26 in core 22 (not shown) is indicated as item 78 in FIG. 5D. Core 22 and coil 24 are typically implemented with the core and coil in the magnetic head of a Sony 525 microcassette recorder.

The apparatus of FIG. 5 is centered around a metal main body 80. A thin elongated flexible metal beam 82 welded to a shim 84 is connected by a bolt 86 to an angled part of the bottom surface of main body 80. Magnetic head 18 is connected to flexible beam 82 through a rigid right-angled damper plate 88. Specifically, head 18 is attached to a vertical portion of damper plate 88, while beam 82 is attached to a nearly lateral portion of plate 88. The vertical portion of plate 88 is shown in dashed line in FIG. 5A. The combination of flexible beam 82 and damper plate 88 forms a dampened flexible member that enables head 18 to be moved through a small distance in the vertical (z) direction relative to main body 80.

A gas channel 90 extends through main body 80 and terminates in a nozzle 91 near the bottom of magnetic head 18. Gas channel 90 is shown in dashed line in FIG. 5A. Screws 94 close off unwanted openings that result from machining channel 90 and nozzle 91 through main body 80. Nozzle 91, which has an orifice 92, is slanted at an angle in the vicinity of 20° from the vertical.

A gas-inlet fitting 96 is inserted into the end of channel 90 opposite orifice 92. A transparent tube 98 is attached to fitting 96 for connecting channel 90 to a source (not shown) of a suitable non-reactive gas such as nitrogen. The gas source includes a gas meter, a valve, and a pressure regulator (all not shown) that control the amount of gas flowing through channel 90. The gas source also includes an ionizer (likewise not shown) for preventing electrostatic discharge.

The combination of components 80, 82, 84, 86, 88, 90–92, 94, 96, and 98, including the (unshown) gas source, forms a mechanism that controls the height of magnetic head 18 above baseplate structure 10. Gas from the gas source is controlled so as to flow through tube 98 and into channel 90 at a selected largely constant flow rate. The gas then flows out of nozzle 91 to form a gas cushion below head 18. The gas cushion maintains head 18 at a selected height above baseplate structure 10. This height is typically 25–50 $\mu$m, preferably 35–45 $\mu$m.

The above-mentioned location sensor utilized for determining the lateral position of magnetic head 18 relative to one or more reference locations on baseplate structure 10 has an optical pick-up mechanism attached to head 18. The optical pick-up mechanism consists of a light-emitting diode ("LED") light source 100 and a phototransistor light sensor 102. LED light source 100, which is located near the top of head 18, is formed with an infrared ("IR") LED and a lens. The LED is controlled through electrical lines (not shown). Phototransistor light sensor 102, which is located near the bottom of head 18, consists of a phototransistor and a transparent body that encloses the phototransistor. The phototransistor provides an output signal on an electrical line (not shown) connected to the remainder of the location sensor for determining the lateral position of head 18 relative to baseplate structure 10 and thus the lateral position where current flows in structure 10 below head 18.

Figure 6:
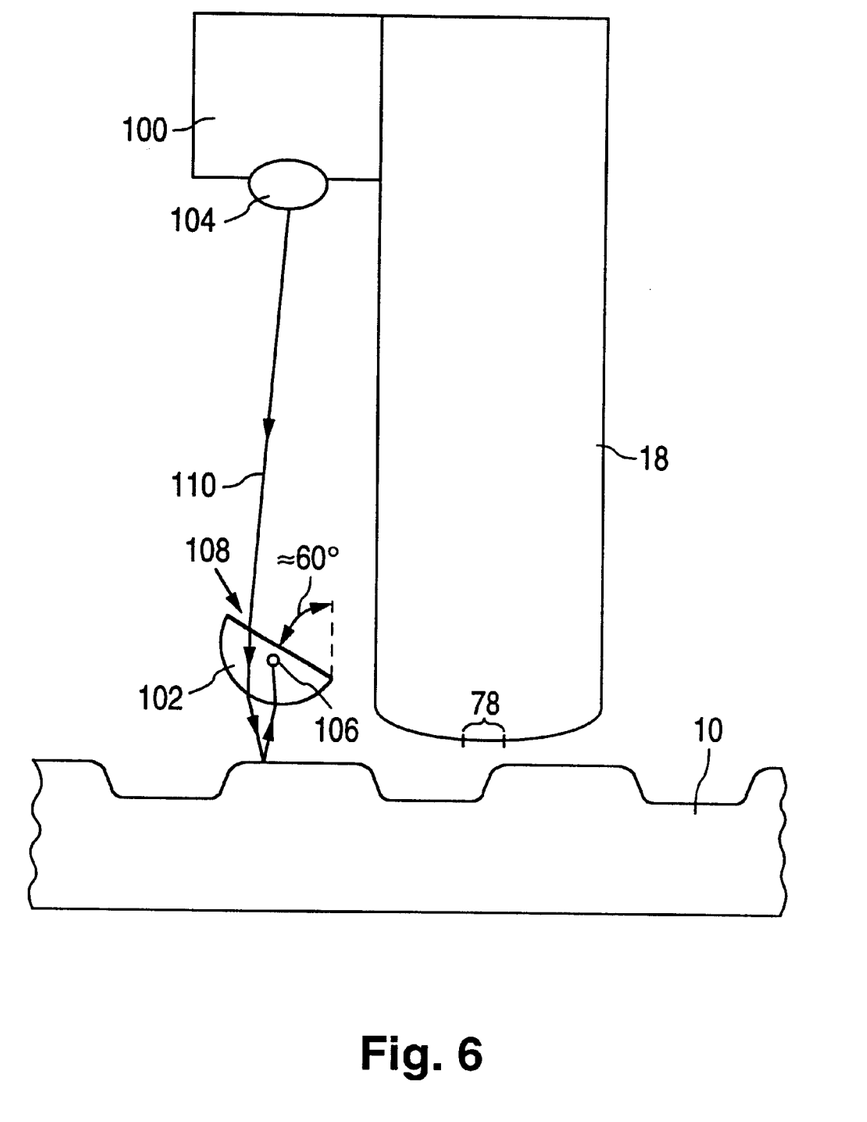
FIG. 6 is a schematic diagram of an optical pick-up mechanism configured according to the invention for use in the location sensor contained in the current sensor of FIGS. 5A–5D.

FIG. 6 schematically illustrates how the optical pick-up mechanism functions. Item 104 in FIG. 6 indicates the lens in light source 100. Item 106 indicates the phototransistor in light sensor 102. Light sensor 102 has a flat back surface and a rounded front surface. The back surface of light sensor 102 is at an angle of approximately 60° to the vertical. The entire back surface of light sensor 102 is black (i.e., opaque to light) except for a slit 108 through which light can enter the back surface.

IR light 110 is emitted by the LED in light source 100, is focused by lens 104, and passes through slit 108 into the transparent body of light sensor 102. After being diffracted by the transparent body of light sensor 102, IR light 110 passes out of sensor 102 through its curved front surface and strikes baseplate structure 10. Light 110 reflects off structure 10, enters light sensor 102 through its curved front surface, is diffracted again by the transparent body of sensor 102, and strikes phototransistor 106, causing phototransistor 106 to generate an electrical phototransistor output signal. The value of the phototransistor output signal varies with the topography of the upper surface of structure 10.

Figure 5D:
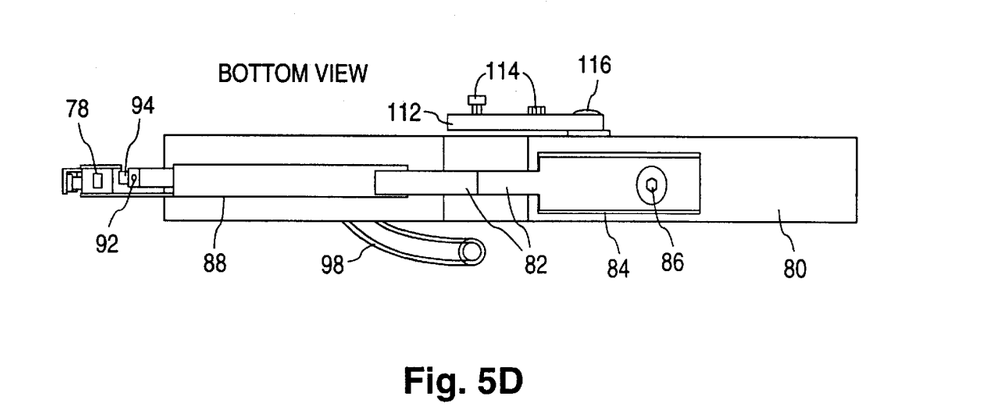

The location sensor contains electronics that process the phototransistor output signal. Using the reference locations on baseplate structure 10, the electronics in the location sensor determine how many of electrodes 32 or 48 have been passed during a scan in the column or row direction starting from a known location. In so doing, the electronics in the location sensor compensate for the lateral distance from the location of phototransistor 106 to the location of opening 78 at the bottom of magnetic head 18. Consequently, the location sensor identifies the particular electrode 32 or 48 whose current is being magnetically sensed by head 18.

Baseplate structure 10 is situated over an xy table (not shown) that can move in both the x and y lateral directions. A vacuum chuck (not shown) holds baseplate structure 10 securely in place on the xy table during the current sensing, optical inspection, and repair operations. The xy table can also be rotated through 360°. Main body 80 of current sensor 16 is mounted on a carriage positioned above the xy table. The carriage enables main body 80 to be moved up to 10 cm horizontally and up to 5 cm vertically.

When magnetic flux sensing is done in the variable-drive mode, driving voltage $V_D$ is typically provided at a frequency of 1 KHz. The location sensor operates at a frequency significantly different from the $V_D$ frequency to avoid confusing the $V_D$ signature. The frequency of the location sensor is typically 2 KHz.

Part of the electronics for signal processing circuitry 20 is mounted on main body 80. In particular, a printed circuit board 112 containing a pre-amplifier formed with circuitry 114 is connected by bolts 116 to one side of main body 80 as shown in FIG. 5. Current $I_f$ from coil 24 is provided to pre-amplifier 114 by way of a co-axial cable (not shown in FIG. 5). Pre-amplifier 114 amplifies current $I_f$ to produce an amplified analog current output signal. The current amplification is performed with an Analog Devices AD797 operational amplifier.

The remainder of the electronics for signal processing circuitry 20 is located away from main body 80 where the amplified version of current $I_f$ is electronically filtered and then sampled at a typical frequency of 20 KHz. The filtering is done with a two-pole Butterworth filter having a cut-off frequency of 5 KHz. The remaining electronic components provide capabilities for valve control, a selectable 1-KHz sine-wave output for drive voltage $V_D$, a 1-KHz sine-wave reference for locking onto the AC signature of voltage $V_D$, a 20-KHz clock, output intensity control, and a selectable 2-KHz square-wave output for the optical pickup synchronized to the 20-KHz sampling rate.

The computer that processes the sampled data utilizes a digital Wiener filter in generating output information $S_O$. The primary programs employed by the computer for processing the sampled data to generate output information $S_O$ are SCAN, SP, and DFX. These programs are provided in microfiche form respectively as Appendices A, B, and C.

While the invention has been described with reference to particular embodiments, this description is solely for the purpose of illustration and is not to be construed as limiting the scope of the invention claimed below. For example, current sensor 16 can be employed to detect open circuit defects in conductor 12 when a suitable driving voltage is applied across conductor 12 as magnetic head 18 crosses over conductor 12. When plate structure 10 is implemented as the baseplate structure of the flat-panel CRT display shown in FIGS. 2 and 3, head 18 is thus scanned across row electrodes 32 as the driving voltage is applied across each electrode 32 during the detection of open circuit defects in electrodes 32. Open circuit defects in column electrodes 48 are detected in the same manner.

The signal processing for open circuit defects is similar to that for short circuit defects. There is one major difference when sensor 16 is utilized in the variable-drive mode with a sinusoidal driving voltage. Due to capacitive effects, the information that provides the current magnitude data for open circuit detection is 90° different in phase from the information that provides the current magnitude data for short circuit defects. Accordingly, the Wiener filter for open circuit detection is adjusted so as to basically pass the information that was rejected for short circuit detection and to basically reject the information that was passed for short circuit detection.

A mechanical technique can be utilized in place of a gas cushion to control the height of magnetic head 18 above plate structure 12. The location sensor in current sensor 16 can determine the location of head 18 relative to structure 10 by integrating the lateral velocity starting from a reference location rather than optically sensing the topography of structure 10.

Sensor 16 can be employed for sensing current in flat-panel devices other than flat-panel CRT displays. Examples include matrix-addressed plasma displays, LCDs, and hybrid integrated circuit packages. Various modifications and applications may thus be made by those skilled in the art without departing from the true scope and spirit of the invention as defined in the appended claims.

We claim:

1. A method of performing short circuit detection on a plate structure in which a group of first electrical conductors are nominally electrically insulated from and, as viewed generally perpendicular to the plate structure, cross a group of second electrical conductors, the method comprising the steps of:

moving a magnetic head over at least part of the first and second conductors to enable the head to sense changes in current-induced magnetic flux and to provide a head output signal indicative of any so-sensed changes in magnetic flux while a driving voltage that varies significantly with time in a prescribed manner is applied between the first conductors, on one hand, and the second conductors, on the other hand;

evaluating the head output signal to produce current data indicative of how much, if any, current flows through each of at least part of the conductors; and examining the current data to determine whether there appears to be a short circuit defect at any location where one of the first conductors crosses one of the second conductors.

2. A method as in claim 1 wherein a location at which an identified one of the first conductors crosses an identified one of the second conductors is classified as having a relatively high probability of having a short circuit defect when each identified conductor is determined to carry sensed current sufficient in value for at least one short circuit defect.

3. A method as in claim 1 wherein the driving voltage varies with time in a generally periodic manner at approximately a selected frequency.

4. A method as in claim 3 wherein the selected frequency differs substantially from 60 Hz and 50 Hz.

5. A method as in claim 3 wherein the selected frequency is at least 70 Hz.

6. A method as in claim 1 wherein the plate structure is a baseplate structure of a flat-panel cathode-ray tube display.

7. A method as in claim 1 wherein, when a location at which an identified one of the first conductors crosses an identified one of the second conductors is determined to have a short circuit defect, the method further includes, subsequent to the examining step, the steps of:
   modifying the current data to subtract current of a selected short circuit value from sensed values of the currents flowing through the two identified conductors; and
   examining the modified current data to determine whether there appears to be a short circuit defect at any other location where one of the first conductors crosses one of the second conductors.

8. A method as in claim 7 wherein the plate structure is a baseplate structure of a flat-panel cathode-ray tube display.

9. A method as in claim 1 further including the step of optically inspecting a location which appears to have a short circuit defect to determine whether that location has physical characteristics of a short circuit defect.

10. A method as in claim 1 further including the step of performing a repair operation for removing any short circuit defect at a location which appears to have a short circuit defect.

11. A method as in claim 1 wherein the moving step entails moving the head over all of at least one of the groups of conductors.

12. A method as in claim 1 further including the step of measuring total current through the first conductors or through the second conductors, there appearing to be a short circuit defect on at at least one location where one of the first conductors crosses one of the second conductors when the total current is sufficient in value for at least one short circuit defect.

* * * * *